(12) United States Patent
Yamaji (10) Patent No.: US 7,313,380 B2
(45) Date of Patent: Dec. 25, 2007

(54) VARIABLE RESOLUTION A/D CONVERTER

(75) Inventor: Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 601 days.

(21) Appl. No.: 10/725,519

(22) Filed: Dec. 3, 2003

(65) Prior Publication Data
US 2004/0125008 A1 Jul. 1, 2004

(30) Foreign Application Priority Data
Dec. 27, 2002 (JP) .............................. 2002-381377

(51) Int. Cl.
*H04B 1/06* (2006.01)
(52) U.S. Cl. ....................... 455/264; 455/267; 455/265; 455/254; 455/574; 455/343.7; 341/126; 341/172; 341/141
(58) Field of Classification Search ................ 455/267, 455/265, 254, 574, 343.7; 341/126, 172, 341/141
See application file for complete search history.

(56) References Cited

U.S. PATENT DOCUMENTS

| | | | | |
|---|---|---|---|---|
| 4,924,227 | A | * | 5/1990 | Mangelsdorf ................ 341/159 |
| 4,937,227 | A | * | 6/1990 | Enz et al. .................... 505/171 |
| 4,940,981 | A | * | 7/1990 | Naylor et al. ................ 341/161 |
| 5,248,973 | A | | 9/1993 | Babu et al. |
| 5,568,142 | A | * | 10/1996 | Velazquez et al. .......... 341/126 |
| 5,610,604 | A | | 3/1997 | Leacock et al. |
| 6,340,944 | B1 | | 1/2002 | Chang et al. |

2002/0158789 A1 * 10/2002 Yoshioka et al. ........... 341/156

FOREIGN PATENT DOCUMENTS

EP 0 838 903 A1 4/1998
JP 2002-359577 12/2002

OTHER PUBLICATIONS

European Search Report issued by European Patent Office on Sep. 27, 2004 in European application No. 03257343.
Setty, P. et al., "FA 9.6: A 5.75b 350Msample/s or 6.75b 150MSample/s Reconfigurable Flash ADC for PRML Read Channel", IEEE International Solid-State Circuits Conference, Digest of Tech. Papers, pp. 148-149, (1998).
Cho, T. B. et al., "A 10 b, 20 Msample/s, 35 mW Pipeline A/D Converter", IEEE Journal of Solid-State Circuits, vol. 30, No. 3, pp. 166-172, (Mar. 1995).
Lee, E. K. F., "Reconfigurable Data Convert as a Building Block for Mixed-Signal Test", Proceedings of 1997 European Design and Test Conference, pp. 359-363, (Mar. 17, 1997).

* cited by examiner

*Primary Examiner*—Nay Maung
*Assistant Examiner*—Richard Chan
(74) *Attorney, Agent, or Firm*—Finnegan, Henderson, Farabow, Garrett & Dunner, L.L.P.

(57) ABSTRACT

A variable resolution analog-to-digital converter includes a sample-and-hold circuit including a plurality of sample-and-hold units which are connected in parallel and selectively activated corresponding to a required resolution to sample and hold an analog input signal, a plurality of conversion stages connected in cascade to an output of the sample-and-hold circuit to convert an output signal of the sample-and-hold circuit to a plurality of bit signals, and a synthesis circuit to synthesize the bit signals, to generate a digital output signal.

14 Claims, 6 Drawing Sheets

VARIABLE RESOLUTION A/D CONVERTER

CROSS-REFERENCE TO RELATED APPLICATIONS

This application is based upon and claims the benefit of priority from the prior Japanese Patent Application No. 2002-381377, filed Dec. 27, 2002, the entire contents of which are incorporated herein by reference.

BACKGROUND OF THE INVENTION

1. Field of the Invention

The present invention relates to an A/D converter (an analog-to-digital converter), and more particularly to an A/D converter with variable resolution suitable for a communication use.

2. Description of the Related Art

There are A/D converters of various types such as a high resolution ADC (analog-to-digital converter) used for digital processing of a speech signal and a high-speed ADC reading a signal on a hard disk. The most of them carries out an A/D conversion with a constant sample rate and a constant resolution. In late years, an ADC of a high speed and a high resolution is demanded in a communication use due to the spread of Internet. The reduction of power consumption of ADC is pursued for a battery-powered device with the ADC.

In radio communications is used a scheme to change a modulation mode as well as a transmission power according to situation. According to, for example, IEEE802.11a which is one of a wireless LAN standard, it is prescribed to use, in environment in which a noise and an interference signal are low, a modulation mode that a frequency utilization efficiency is high and a high speed transmission is possible, and to use, in environment in which much noise and interferences occur, a modulation mode which is hard to come under the influence of noise and interference although it reduces the transmission speed. In a fixed modulation mode, a resolution needed by a ADC changes according to the situation of a signal and a noise. However, a change of the required resolution becomes more remarkable when the modulation mode is changed as described above.

The variable resolution ADC is disclosed in a document 1: P. Setty et al., "A 5.75 b 350 M sample/s or 6.75 b 150 M sample/s reconfigurable flash ADC for a PRML read channel", 1998 IEEE International Solid-State Circuits Conference, Digest of Technical Papers, pp. 148–149, and a document 2: E. K. F. Lee. et al., "Reconfigurable data converter as a building block for mixed-signal test", European Design and Test Conference, 1997. Proceedings, pp. 359–363. In general, it is difficult to realize a high speed and high resolution ADC. The document 1 discloses a technique for lowering a resolution in a fast operation and lowering a conversion rate at the time of a high resolution operation. The document 2 discloses the following technique. For the purpose of a test of an analog-to-digital mixed palletizing integrated circuit, a plurality of conversion stages each comprising a one-bit ADC, a D/A converter and an error amplifier are connected in cascade. The connection of the conversion stages are changed by a switch and the like to use as a DAC, a noise source or an ADC. It is necessary for reducing a power consumption to decide distribution of a current consumption according to a permission noise level as be shown in a document 3: T. B. Cho et al.,. "A 10 b, 20 M sample/s, 35 mW Pipeline A/D Converter"(IEEE Journal of Solid-State Circuits Vol. 30, No. 3, March 1995, pp. 166–172.

A method mentioned in the document 1 is effective in a flash type ADC suitable for a rapid access of a hard disk, but is not enough in resolution for a use of high speed radio communications. Actually, there is often used a pipeline type ADC that is excellent in rapidity more than the flash type ADC in a use of radio communications.

The ADC disclosed in the document 2 is a superior ADC which can execute various tests at a small tip occupation area for testing, but is not suitable for low power consumption due to a pipeline type A/D converter wherein a plurality of completely identical conversion stages are connected in cascade and always operated.

BRIEF SUMMARY OF THE INVENTION

It is an object of the present invention to provide an A/D converter whose resolution is variable and power consumption can be lowered.

According to an aspect of the invention, there is provided a variable resolution A/D converter comprises a sample-and-hold circuit including a plurality of sample-and-hold units which are connected in parallel and selectively used to sample and hold an analog input signal according to required a required resolution, a plurality of conversion stages connected in cascade to an output of the sample-and-hold circuit to convert an output signal of the sample-and-hold circuit to a plurality of bit signals, and a synthesis circuit to synthesize the bit signals, to generate a digital output signal.

DETAILED DESCRIPTION OF THE INVENTION

There will now be described embodiments of the present invention with reference to drawings.

(First Embodiment)

Figure 1:
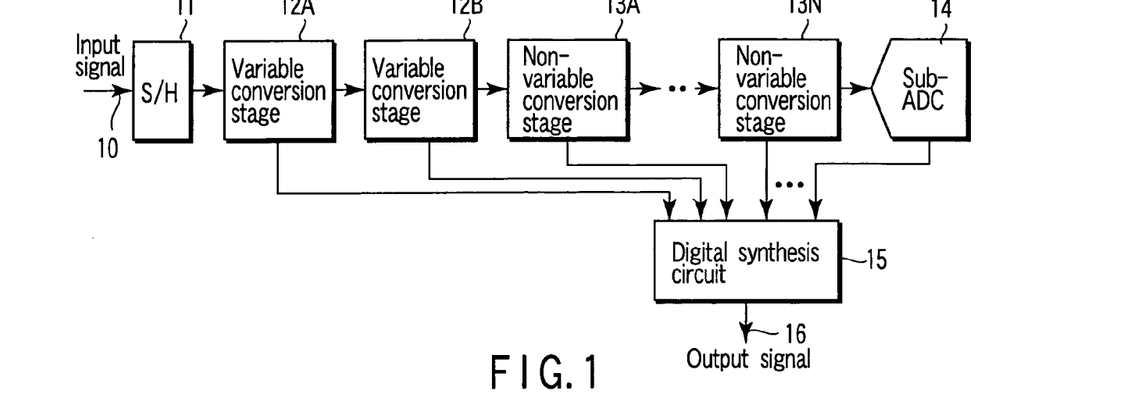
FIG. 1 is a block circuit diagram of an A/D converter concerning a first embodiment of the present invention.

FIG. 1 shows a configuration of a pipeline type A/D converter (analog-to-digital converter) related to the first embodiment of the present invention. The output terminal of a sample-and-hold circuit (S/H) 11 supplied with an analog input signal 10 is connected to a sub-A/D converter (sub-ADC) 14 through a plurality of conversion stages 12A, 12B, and 13A to 13N that are connected in cascade. The front conversion stages 12A and 12B are referred to as variable conversion stages, and the rear conversion stages 13A to 13N are called non-variable conversion stages.

The output terminals of the conversion stages 12A, 12B, and 13A to 13N and sub-AD converter 14 are connected to the input terminals of a digital synthesis circuit 15. In the pipeline type A/D converter of the above configuration, when the analog input signal 10 is input to the sample-and-hold circuit (S/H) 11, the signal 10 is sampled and held during a given time by the sample-and-hold circuit 11.

The held signal of the sample-and-hold circuit 11 is input sequentially to the variable conversion stages 12A and 12B and the non-variable conversion stages 13A to 13N. Each of the conversion stages 12A and 12B and 13A to 13N converts an input analog signal into a digital signal of relatively a few bits, and output an analog residual signal showing a conversion error of the converted digital signal to the following stage. The analog residual signal output by the last non-variable conversion stage 13N is converted into a digital signal by the sub-A/D converter 14. The conversion stages 12A, 12B and 13A to 13N are described in detail later.

The digital signals output by the conversion stages 12A and 12B and 13A to 13N and the sub-A/D converter 14 are synthesized by the digital synthesis circuit 15 to generate a digital output signal 16 that is of a high resolution as the whole. In this case, the digital signal output from the initial conversion stage 12A is on the most significant bit side of the digital output signal 16, and the digital signal output by the sub-A/D converter 14, that is, digital signal obtained by A/D converting the analog residual signal output by the last conversion stage 13N is on the least significant bit side of the digital output signal 16.

The digital signals which are output by the conversion stages 12A and 12B and 13A to 13N and the sub-A/D converter 14 respectively have relative delay times. Each of the relative delay times corresponds to a total time of the delay times of the stages form the first stage (12A) to the n-th stage (12B, 13A . . . or 13N) with respect to the same analog signal output from the sample-and-hold circuit 11. Therefore, the digital synthesis circuit 15 must compensate the relative delay times and then synthesize the digital signals.

Figure 2:
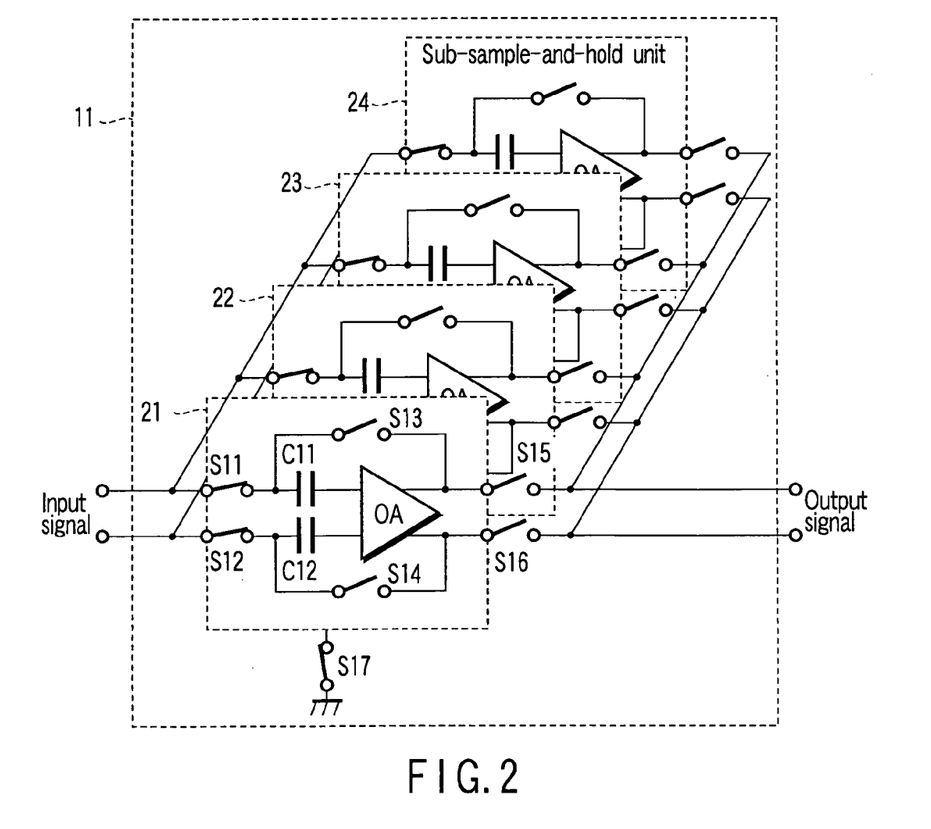
FIG. 2 is a circuit diagram of a sample-and-hold circuit in FIG. 1.

FIG. 2 shows a concrete configuration of the sample-and-hold circuit 11. The sample-and-hold circuit 11 comprises four sample-and-hold units 21 to 24 which are connected in parallel. Each of the sample-and-hold units 21 to 24 comprises a conventional differential sample-and-hold circuit including an operational amplifier OA, capacitors C11 and C12, sample switches S11 and S12, and hold switches S13 to S16. A bias current switch S17 to turn on and off a bias current is connected to each of the sample-and-hold units 21 to 24.

The capacitors C11 and C12 must be of a large capacity to reduce a noise in a case that the A/D converter needs an output of a high resolution as a whole. The A/D converter of the present embodiment is configured so that the resolution can be switched to, for example, 10 bits and 9 bits. The resolution corresponds to the number of bits of the digital output signal 16 output by the A/D converter. Since a noise voltage is inversely proportional to a square root of the capacity, the capacity of the capacitors C11 and C12 that is necessary for obtaining the resolution of 10 bits is 4 times that necessary to get the resolution of 9 bits.

The resolution of 10 bits assumes to be a 10 bits mode, and the resolution of 9 bits assumes to be a 9 bits mode. In the 10 bits mode, all of the four sample-and-hold units 21 to 24 are operated, whereas in the 9 bits mode a single sample-and-hold unit is operated. In the 9 bits mode, the bias current switch S17 of the sub-sample-and-hold unit is turned off to cut off the bias current of the sample-and-hold unit. Thus, a current consumption can be reduced.

In the pipeline type A/D converter concerning the present embodiment, the noise becomes lower as the conversion stage comes near the input terminal for the analog input signal 10. This requires a capacitor of larger capacity, resulting in increasing the current consumption of the amplifier for driving the conversion stage. In the present embodiment, the sample-and-hold circuit 11 as an input circuit comprises a plurality of sub sample-and-hold units 21 to 24 that are connected in parallel, and only the sample-and-hold units whose number corresponds to a necessary resolution (or a required or targeted resolution) are activated to sample and hold a signal. In other words, one or more of the sub sample-and-hold units 21 to 24 are selectively activated corresponding to the necessary resolution. As a result, the current consumption of the amplifier in the 9 bits mode can be preferably reduced to a quarter that of the 10 bits mode.

Figure 3:
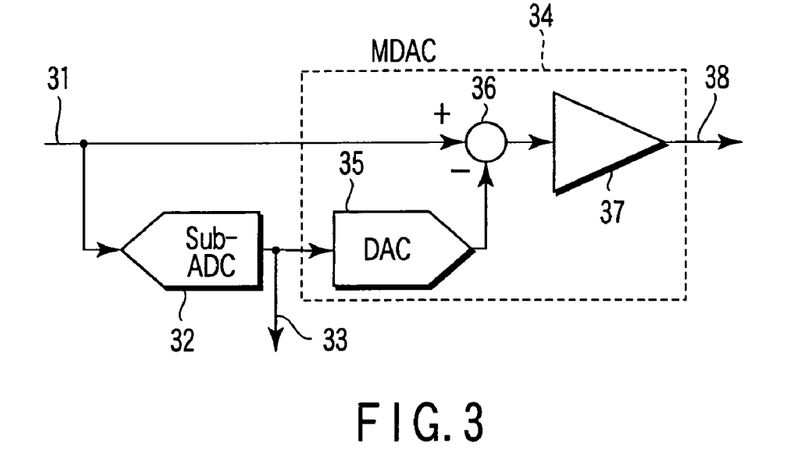
FIG. 3 is a block circuit diagram of a non-variable conversion stage in FIG. 1.
Figure 4:
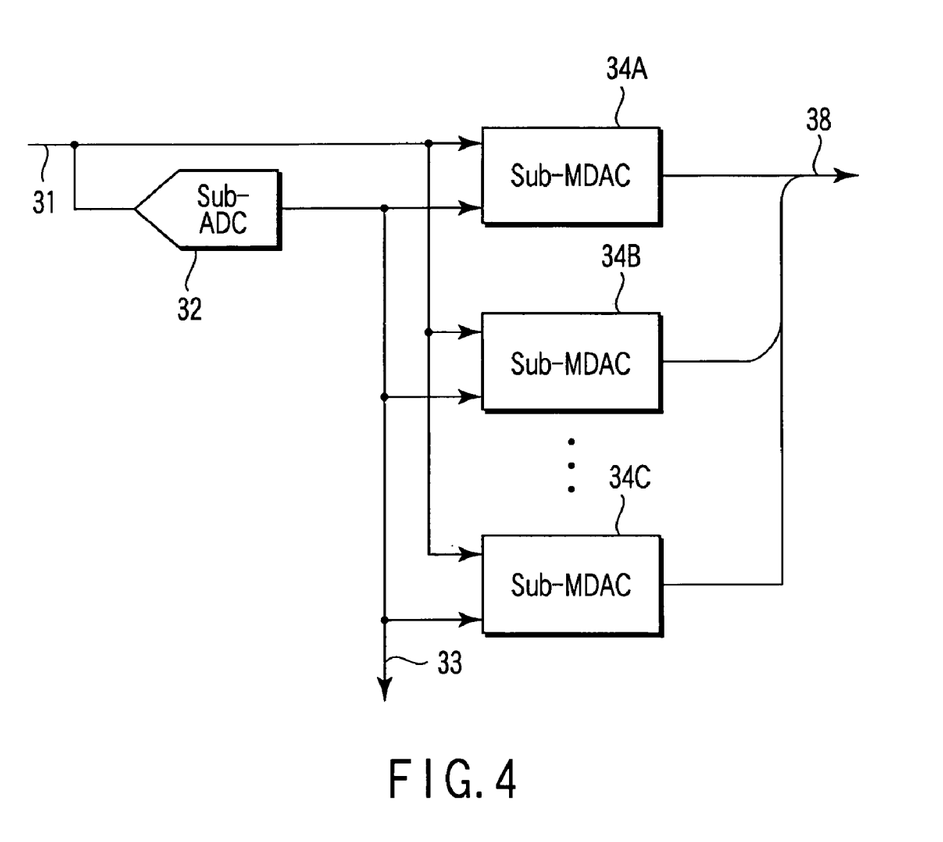
FIG. 4 is a block circuit diagram of a variable conversion stage in FIG. 1.

The variable conversion stages 12A and 12B and the non-variable conversion stages 13A to 13N are described referring to FIGS. 3 and 4.

FIG. 3 shows the configuration of one of the non-variable conversion stages 13A to 13N. To the one non-variable conversion stage is input an analog signal output from the last variable conversion stage 12B or the non-variable conversion stage followed by the one non-variable conversion stage. An input analog signal 31 is converted to a digital signal 33 of relatively a few bits by a sub A/D converter 32. The digital signal 33 output by the sub A/D converter 32 is input to the digital synthesis circuit 15 of FIG. 1 and MDAC (multiplying digital-to-analog converter) 34.

The MDAC 34 is a kind of DAC including a sub-DAC 35, a subtracter 36 and a residual amplifier 37 to subject an input digital signal to a D/A conversion, generate a difference signal between an input analog signal and a D/A converted signal and multiply the difference signal by a given value. The digital signal 33 from the sub-ADC 32 is converted into an analog signal by a sub-DAC 35. A difference signal between this analog signal and the analog signal 31 input to the non-variable conversion stage is obtained by the subtracter 36. The difference signal output from the subtracter 36 (called a residual signal) is amplified by the residual amplifier 37. The analog residual signal 38 output from the residual amplifier 37 is output to the next non-variable conversion stage.

FIG. 4 shows the configuration of one of the variable conversion stages 12A and 12B. The analog signal 31 output from the sample-and-hold circuit 11 of FIG. 1 or the front variable conversion stage 12A is input into the variable conversion stage.

The input analog signal 31 and the digital signal 33 output by the sub-ADC 32 are input to the digital synthesis circuit 15 and a plurality of sub-MDAC 34A to 34C connected in parallel to one another. The sub-MDAC 34A to 34C each are configured like the MDAC 34 shown in FIG. 3 and comprises a sub-DAC 35, a subtracter 36 and a residual amplifier 37.

As thus described, the non-variable conversion stage is only a conversion stage having the MDAC shown in FIG. 3. On the other hand, the variable conversion stage is realized by a MDAC configured by a plurality of sub-MDACs connected in parallel as shown in FIG. 4. The number of sub MDACs to be activated is changed corresponding to a necessary resolution. In the 10 bits mode, all of the sub-MDACs 34A to 34C in FIG. 4 are activated to output respective analog residual signals. The analog residual signals of the sub-MDACs 34A to 34C are added to output an analog signal. In the 9 bits mode, only one of the sub-MDACs is activated to output an analog residual signal. Accordingly, a current consumption of the conversion stage can be reduced in the 9 bits mode.

It is not impossible to use variable conversion stages for all conversion stages. However, in this case, the conversion stage of the least significant bit side reduces the needed capacity value of a capacitor, so that it is impossible to ignore the influence of parasitic capacitance. Accordingly, an advantage to use the variable conversion stage is lost. For this reason, in the present embodiment, the variable conversion stages 12A and 12B are used on the most significant bit side near to the input terminal, whereas the non-variable conversion stages 13A to 13N are used on the least significant bit side.

Figure 5A:
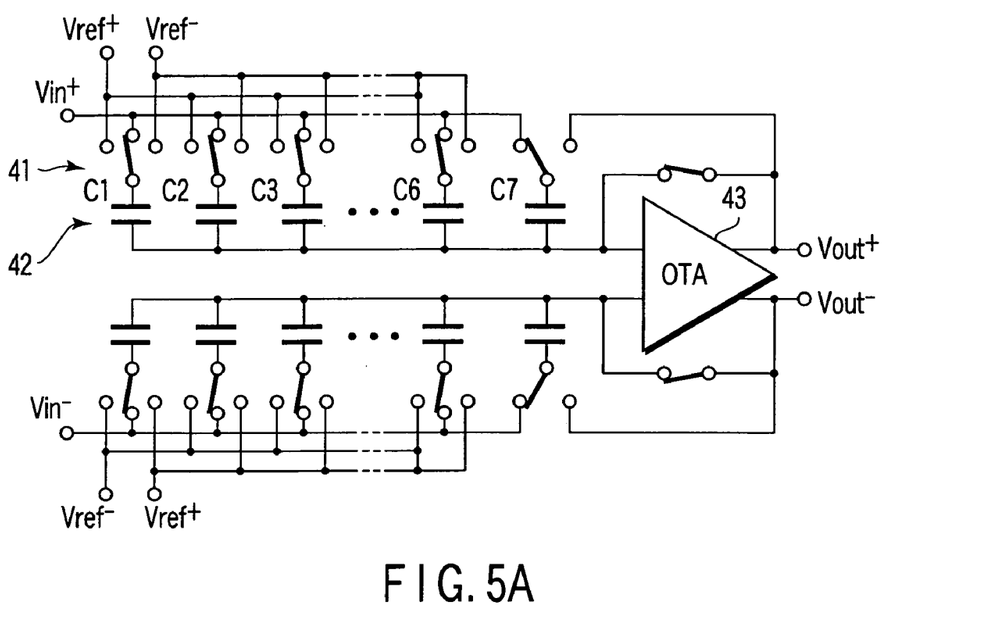
FIGS. 5A and 5B are circuit diagrams of MDAC in FIG. 3.
Figure 5B:
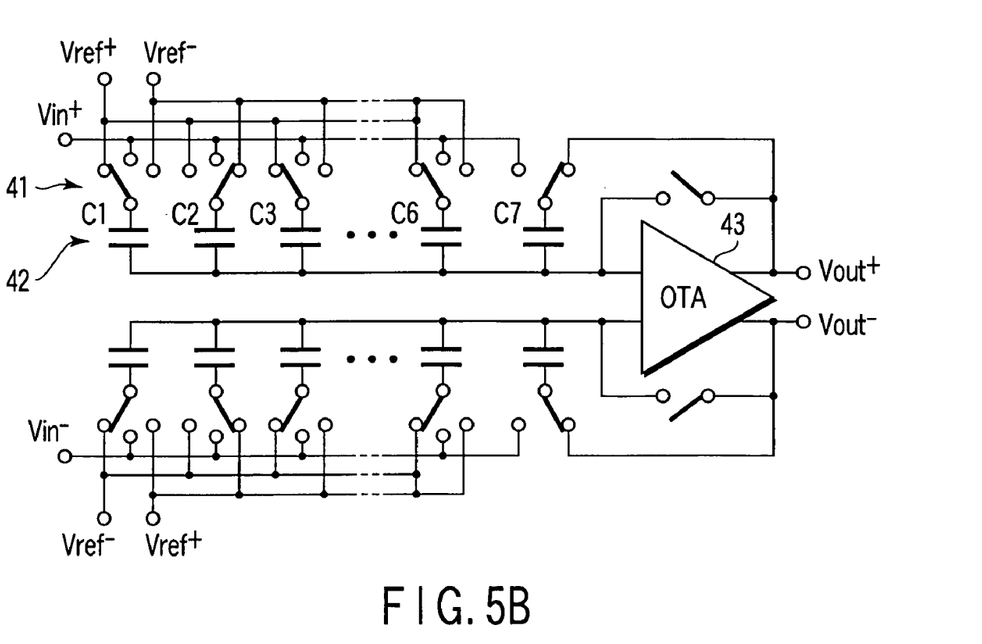

FIGS. 5A and 5B show concrete circuitry examples of the MDAC 34 shown in FIG. 3. The MDAC 34 comprises a switched capacitor unit including a switch group 41, a capacitor group 42 and an OTA (Operational Transconductance Amplifier) 43. The switch group 41, the capacitor group 42 and the OTA 43 correspond to the DCA, the subtracter 36 and the residual amplifier, respectively. The capacitors C1 to C6 of the capacitor group 41 have the same capacitance and the capacitor C7 has a capacitance twice that of each of the capacitors C1 to C6.

The signal output by the sample-and-hold circuit 11 or the preceding conversion stage is supplied to MDAC 34 as a positive phase input signal Vin+, and the analog signal from the DAC 35 is supplied to the MDAC 34 as a negative phase signal input signal V in−. The residual signal that is a difference signal between these signals is output as a differential output signal V out+, V out− from the MDAC 34. The operation of the MDAC of FIGS. 5A and 5B repeats a sample-and-hold mode and an amplification mode alternately.

In the sample-and-hold mode, the switch group 41 connects all capacitors C1 to C7 of the capacitor group 41 to the input terminal as shown in FIG. 5A and short-circuits the input and output of the OTA 43. On the other hand, in the amplification mode, the switch group 41 operates as shown in FIG. 5B to apply a positive reference voltage Vref+ or a negative reference voltage Vref− to the capacitors C1 to C6 of the capacitor group 42.

The A/D converter of the present embodiment can switch the resolution to a plurality of stages such as the 10 bits mode (high resolution mode) and the 9 bits mode (low resolution mode). In the sample-and-hold circuit 11, the sampling and holding are performed using the sample-and-hold units 21 to 24 connected in parallel, one or more of which are selectively activated corresponding to a necessary resolution. This reduces a current consumption in the low resolution mode.

On the other hand, in the variable conversion stages 12A and 12B which are disposed on the output side (the most significant bit side) of the sample-and-hold circuit 11, the input analog signal 31 output from the pre-stage is converted into a digital signal 36 by using the MDACs 34A to 34C connected in parallel, one or more of which are selectively activated corresponding to a necessary resolution. In this time, a difference signal (residual signal) between the analog signal converted by the DAC 35 and the analog signal 31 is output to the next conversion stage. This reduces the current consumption in the conversion stage.

As described above, the A/D converter of the present embodiment can change a resolution as needed and reduce the power consumption when the resolution is low. Therefore, when the A/D converter of the present embodiment is applied to a radio receiver, the power consumption can be balanced with a transmission rate. The present embodiment is effective for a portable radio communications unit using a battery as a power source. When the present A/D converter is compared with an A/D converter of a fixed resolution in, for example, a situation of a low transmission rate, the radio communication unit using the present A/D converter can communicate for a long time using a battery of the same capacity.

(Second Embodiment)

Figure 6:
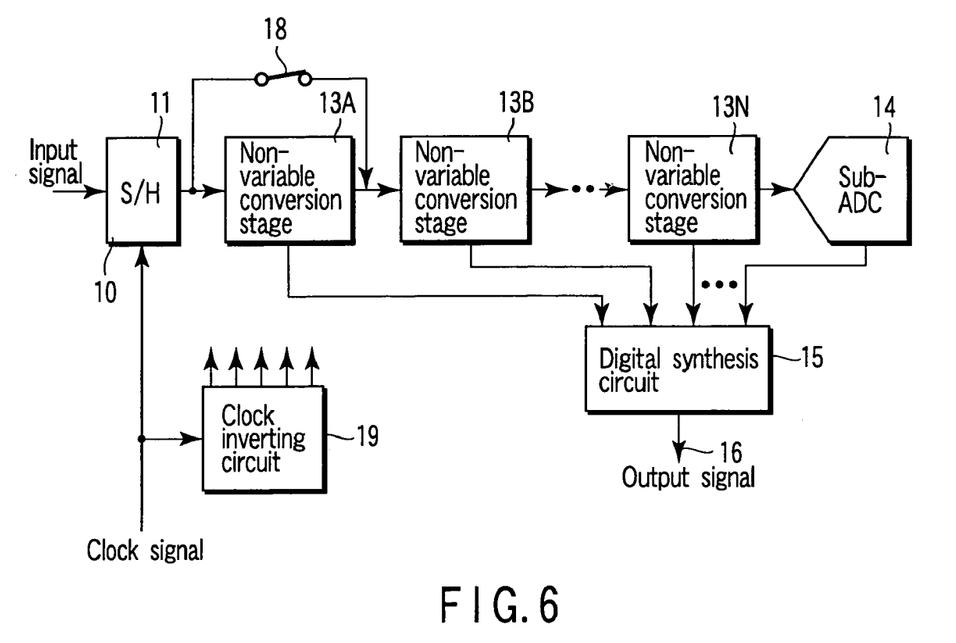
FIG. 6 is a block circuit diagram of an A/D converter concerning a second embodiment of the present invention.

FIG. 6 shows the configuration of a pipeline type A/D converter related to the second embodiment of the present invention. The sample-and-hold circuit 11 comprises a plurality of sample-and-hold units 21 to 24 connected in parallel to one another like the first embodiment of FIG. 2, and performs sampling holding of an analog input signal 10 by the sample hold units, one or more of which are selectively activated corresponding to a necessary resolution.

In the present embodiment, the non-variable conversion stages 13A to 13N shown in FIG. 3 are used as a plurality of conversion stages connected in cascade to the rear stage of the sample-and-hold circuit 11. A bypass switch 18 is connected in parallel to the first stage 13A of the non-variable conversion stages 13A to 13N, that is, between the input and output terminals of the conversion stage 13A.

The bypass switch 18 turns on or off corresponding to a necessary resolution. In other words, in a high resolution mode, for example, a 10 bits mode, the bypass switch 18 turns off to activate the conversion stage 13A. In a low resolution mode, for example, a 9 bits mode, the bypass switch 18 turns on to cut off the bias current of the conversion stage 13A and stop the operation of the conversion stage 13A.

As explained above, the conversion stage of the pipeline type ADC requires a capacitor of a capacity increasing with approximating the input. A large drive power is required for driving such a conversion stage. Accordingly, it is necessary to use an amplifier of a large power consumption. According to the present embodiment, the power consumption can effectively reduce by releasing the first conversion stage 13A when the resolution can be reduced by 1 bit.

The odd-numbered conversion stages 13A, 13C, . . . , perform A/D conversion when the sample-and-hold circuit 11 is in a hold mode, and carry out holding of an output as well as A/D conversion when it is in a sample mode. The even-numbered conversion stages 13B, . . . , do an operation inverting to that of the odd-numbered conversion stages 13A, 13C, . . . . For this reason, when one conversion stage 13A is by-passed as in the present embodiment, the clock signal to be supplied to each of the other conversion stages 13B to 13N must be inversed with respect to a phase. The clock signal supplied to the conversion stages 13B to 13N is used to operate sub-ADC 32 and MDAC 34 as shown in FIG. 3.

A clock inverting circuit 19 shown in FIG. 6 performs a phase inversion of such a clock signal. In other words, the phase of the clock signal supplied to the conversion stages 13B to 13N when the bypass switch 18 is ON is inversed with respect to the phase when the bypass switch 18 is OFF. Since the first conversion stage 13A stops when the bypassing switch 18 is ON, only the phase of the clock signal to be supplied to the conversion stages 13B to 13N needs not to be always inversed. The phase of the clock signal to be supplied to all conversion stages 13A to 13N may be inversed.

(Third Embodiment)

Figure 7:
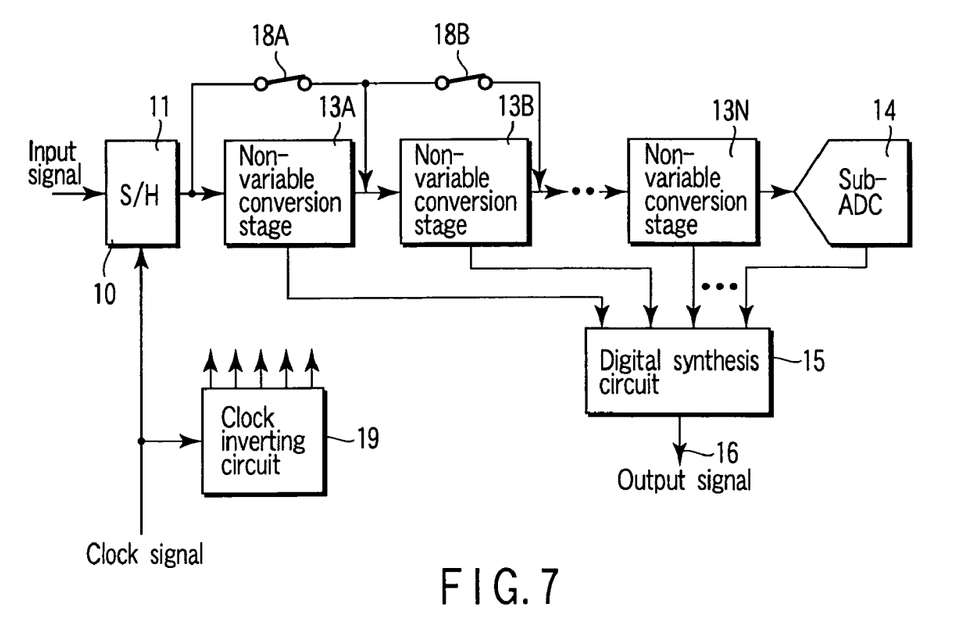
FIG. 7 is a block diagram of an A/D converter concerning a third embodiment of the present invention.

FIG. 7 shows a configuration of a pipeline type A/D converter related to the third embodiment of the present invention. All conversion stages are non-variable conversion stages 13A to 13N like the second embodiment. In the present embodiment, there is provided a bypass switch 18B for bypassing the second conversion stage 13B as well as a bypass switch 18A for bypassing the first conversion stage 13A.

When a converter circuit including the sub-ADC 32 outputting a digital signal of 1 bit or 1.5 bits is used as the conversion stages 13A to 13N, switching function of 2-bit width in unit of 1 bit, namely three phases of resolution are can be realized. In this case, if 16 sub-sample-and-hold units connected in parallel are used for the sample-and-hold circuit 11, when the resolution is reduced by 1 bit, the current consumption can be reduced by $1/16$. When the resolution is reduced by 2 bits, the current consumption can be decreased to $4/16$. On the other hand, a clock inverting circuit 19 inverts the clock signal only when the resolution is reduced by 1 bit.

(Fourth Embodiment)

Figure 8:
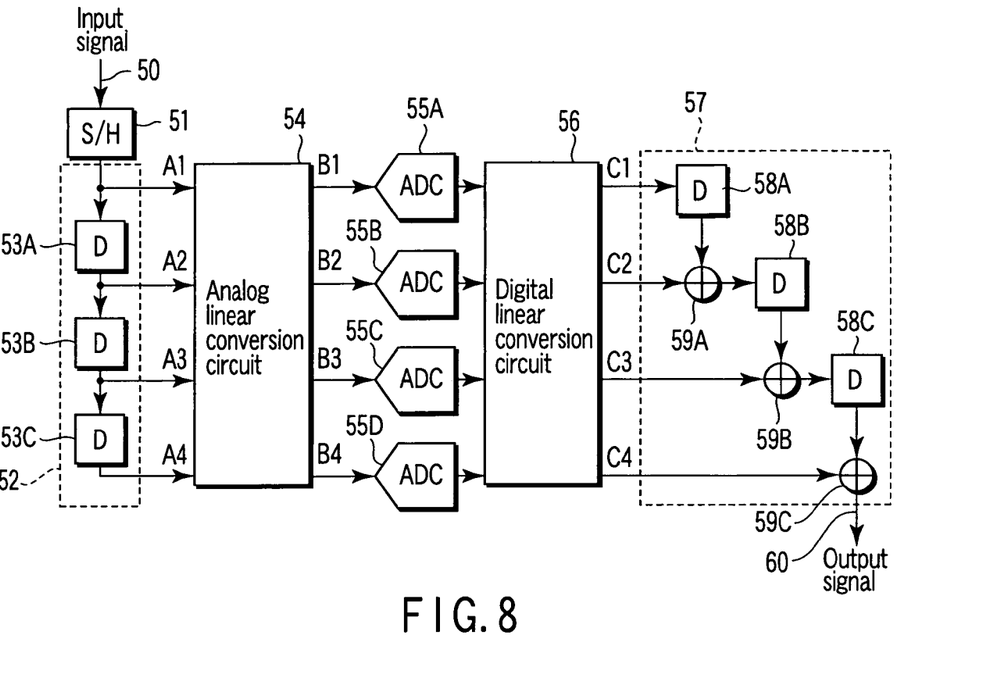
FIG. 8 is a block diagram of an A/D converter concerning a fourth embodiment of the present invention.

FIG. 8 shows a configuration for an A/D converter concerning the fourth embodiment of the present invention. An analog input signal 50 is sampled and held by a sample-and-hold circuit 51. The sample-and-hold circuit 51 comprises a plurality of sample-and-hold units connected in parallel like the first embodiment shown in FIG. 2, and samples and holds the analog input signal 50 with the sample-and-hold units one or more of which are selectively activated corresponding to a necessary resolution.

The analog signal sampled and held by the sample-and-hold circuit 51 is input to an analog delay circuit 52. The analog delay circuit 52 comprises a plurality of (for example, three) unit delay circuits 53A to 53C connected in cascade to delay the sampled and held analog signals by the same unit time. The analog delay circuit 52 generates four analog output signals having a relativity delay time determined by the delay time of the unit delay circuits 53A to 53C and including the analog signal output from the sample-and-hold circuit 51.

Figure 9:
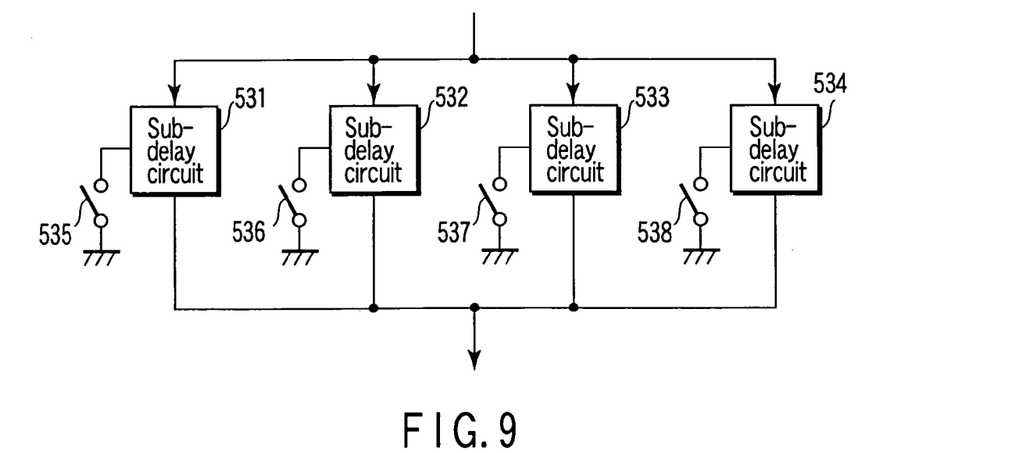
FIG. 9 is a block circuit diagram of a unit delay circuit in FIG. 8.

The unit delay circuits 53A to 53C comprises a plurality of sub-delay circuits 531 to 534 connected in parallel as shown in FIG. 9. The analog signal output from the sample-and-hold circuit 51 is delayed by the sub-delay circuits, one or more of which are selectively used corresponding to a necessary resolution. In other words, bias current switches 535 to 538 for turning on and off a bias current are connected to sub-delay circuits 531 to 534 respectively. The delay circuits 531 to 534 can be turned on and off in operation with these switches 535 to 538.

The four analog signals output from the analog delay circuit 52 are input to an analog linear conversion circuit 54. The analog linear conversion circuit 54 comprises four weighted adder circuits to which four analog signals A1 to A4 output from the analog delay circuit 54 are supplied in common as shown by an equivalent circuit of FIG. 10. In other words, the analog signals A1 to A4 are weighted in different weighting factors with 16 weighting units 61A to 64D. Thereafter, the weighted analog signals A1 to A4 are added with four adders 65A to 65D. As a result, the analog signals A1 to A4 are subjected to a linear transformation (first linear transformation) to generate four linear transformed analog signals B1 to B4. The weighting unit comprises a multiplier for multiplying the weighting factor by the input analog signal to subject the analog signal to weighting.

Figure 10:
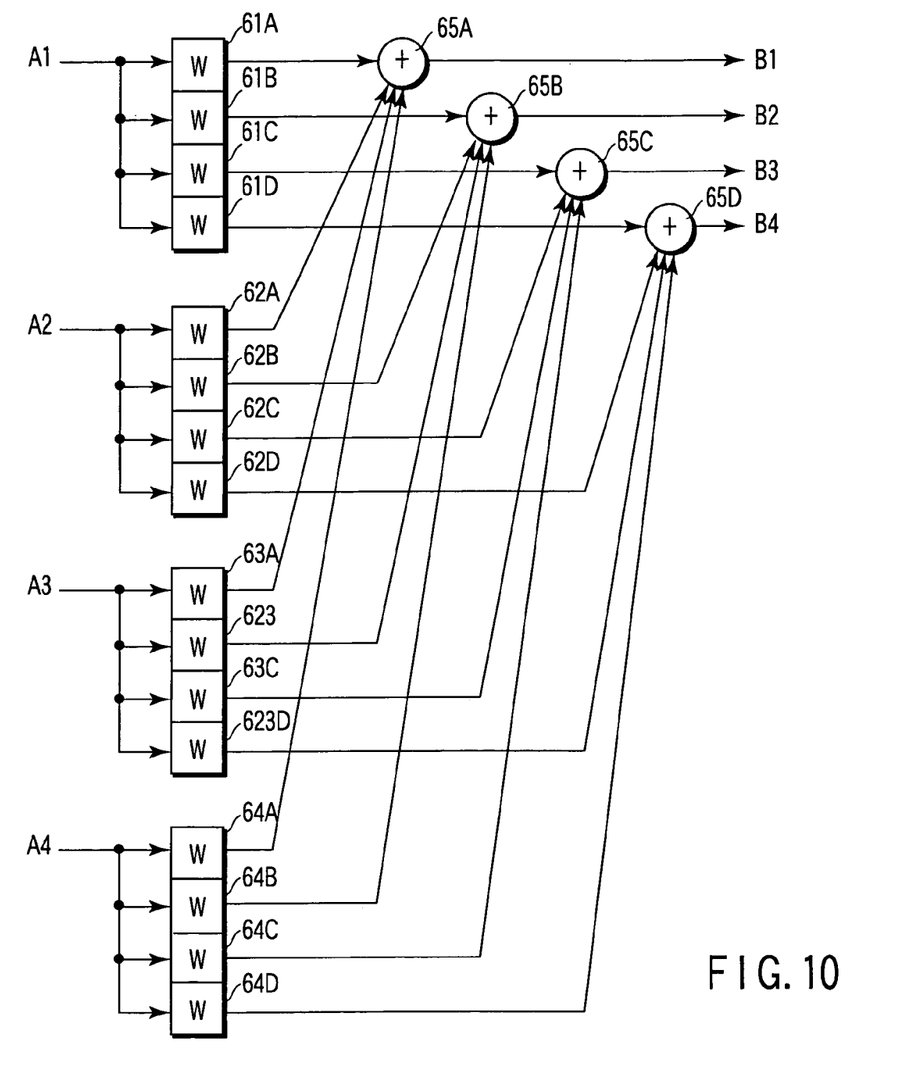
FIG. 10 is an equivalent circuit schematic of an analog linear transform circuit in FIG. 8.

More specifically, the signal A1 is weighted with the weighting units 61A to 61D, the signal A2 with the weighting units 62A to 62D, the signal A3 with the weighting units 63A to 63D, and the signal A4 with the weighting unit 64A to 64D. The adder 65A adds the outputs of the weighting units 61A, 62A, 63A and 64A, the adder 65B adds the outputs of the weighting units 61B, 62B, 63B and 64B, the adder 65C adds the outputs of the weighting unit 61C, 62C, 63C and 64C, and the adder 65D adds the outputs of the weighting units 61D, 62D, 63D and 64D. As a result, the linear transformed analog signals B1 to B4 are generated.

In this way, since the weighting factors given to the four linear analog signals B1 to B4 output from the analog linear transformation circuit 54 differ from one another, the linear transformed analog signals B1 to B4 are different in a statistical property. In other words, the analog input signal 50 is disassembled, by the analog delay circuit 52 and the analog linear transformation circuit 54, into the linear transformed analog signals B1 to B4 which are a plurality of analog signal components different in statistical property from one another.

The linear transformed analog signals B1 to B4 are converted into digital signals with sub-ADC 55A to 55D respectively. The four digital signals output from the sub-ADC 55A to 55D are input into a digital linear transformation circuit 56. The digital linear transformation circuit 56 subjects the four input digital signals to second linear transformation that is a transformation inverting with respect to the first linear transformation of the analog linear transformation circuit 54, to output four linear transformed digital signals C1 to C4. Therefore, the linear transformed digital signals C1 to C4 are analog signals before doing the first linear transformation with the analog linear transformation circuit 54, that is, equivalent to digital signals obtained by analog-to-digital conversion of the analog output signals A1 to A4 generated by the analog delay circuit 52.

The linear transformed digital signals C1 to C4 are input into a digital delay adder circuit 57. The digital delay adder circuit 57 comprises three unit delay circuits 58A to 58C having the same unit time delay as that of the unit delay circuits 53A to 53C of the analog delay circuit 52 and three adders 59A to 59C. The linear transformed digital signals C1 to C4 are delayed with the same relative delay time as that of the analog delay circuit 52 and added, to generate a digital output signal 60 subjected to analog-to-digital conversion.

In other words, the linear transformed digital signals C1 to C4 are input to the unit delay circuit 58A and the adders 59A, 59B and 59C, respectively. The outputs of the adders 59A and 59B are input to the unit delay circuits 58B and 58C, respectively, and a digital output signal 60 is output by the last stage adder 58C. The digital delay adder circuit 57 generates the digital output signal 60 corresponding to the analog input signal 50 by performing processing inverting with respect to the analog delay circuit 52.

As thus described, in the A/D converter of the present embodiment, the analog input signal 50 is sampled and held by the sample-and-hold circuit 51 and then disassembled into a plurality of analog signal components different in statistical property from one another through the analog delay circuit 52 and the analog linear transformation circuit 54. Thereafter, the signal components are converted into digital signals by the sub-ADCs 55A to 55D, respectively. The digital signals output by the sub-ADCs 55A to 55D are combined through the digital linear transformation circuit 56 having inverting transformation characteristics with respect to the analog linear transformation circuit 54 and the digital delay adder circuit 57, to output the digital output signal 60.

Such a configuration can improve a SN ratio by controlling a quantization noise effectively even if an individual resolution of the sub-ADCs 55A to 55D is low, to realize a A/D converter of a high resolution.

According to the above A/D converter, when, for example, ADCs of a 10 bits resolution as described in the preceding embodiment are used as sub-ADCs 55A to 55D, a 11 bits resolution can be realized. Usually, even if ADC generates the output of the 10 bits resolution, the effective resolution reduces to 9.5 bits with respect to a signal-noise power ratio due to the affection of error or noise. When the analog linear transformation circuit 54 is disposed before the sub-ADCs 55A to 55D like the present embodiment, using the sub-ADCs 55A to 55D with the effective resolution of 9.5 bits, an A/D converter of the effective resolution of 10.5 bits can be realized.

When making a matrix of linear transformation in the analog linear transformation circuit 54 variable, that is, using a variable analog linear transformation circuit whose linear transformation matrix is variable, it is possible to realize an analog-digital converter with an effective resolution of 10 bits by using two of four sub-ADCs 55A to 55D. Under certain circumstances it can use only a sub ADC. As thus described, the advantage of the present embodiment is to be able to control the effective resolution of A/D converter in units of not 1 bit but 0.5 bits. In the configuration that four sub-ADC 55A to 55D are arranged in parallel like the present embodiment, the variable range of resolution is 1 bit. However, it is possible to keep a variable range of 2 bits when, for example, 16 sub-ADCs are used, and a variable range of 3 bits when 64 sub-ADCs are used. Further, the digital linear transformation circuit 56 may comprise a variable digital linear transformation circuit whose linear transformation matrix is variable.

In the present embodiment, a resolution required by the A/D converter, in this example, the number of sample-and-hold units that sample and hold the analog signal 50 in the sample-and-hold circuit 51 according to the number of parallel sub-ADCs is decreased or increased like the above embodiment. Further, in the present embodiment, the number of sub-delay circuits used for delaying an analog signal actually is increased and decreased in the unit delay circuits 53A to 53C of the analog delay circuit 52. Specifically, in a high resolution mode, the number of sample-and-hold units to sample and hold an analog signal actually and the number of sub-delay circuits to actually delay the analog signal are increased. In a low resolution mode, they are decreased. Thus, a current consumption can be reduced according to the resolution.

In the present embodiment, a combination of the analog linear transformation circuit 54 and the digital linear transformation circuit 56 may be, for example, a combination of an analog DCT circuit and a digital IDCT (inverting DCT) circuit, a combination of an analog DFT (discrete Fourier transform) circuit and a digital IDFT (inverting discrete Fourier transform) circuit, a combinations of an analog unitary converter circuit or a digital inverting unitary converter circuit.

There will now be described a radio receiver using a variable resolution analog-to-digital conversion circuit of the present invention.

Figure 11:
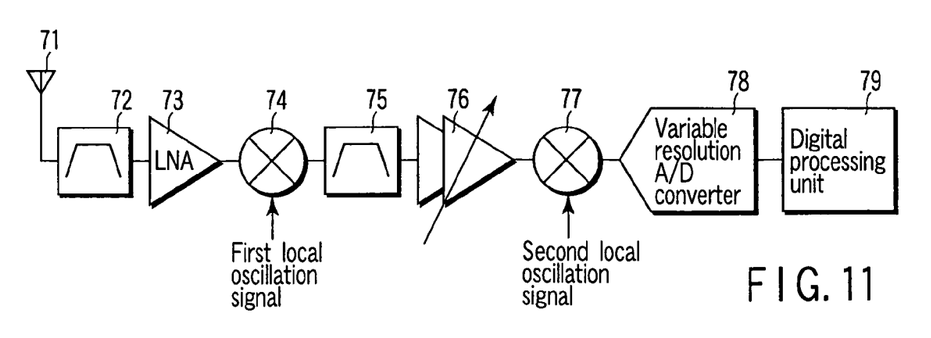
FIG. 11 is a radio receiver using a variable resolution A/D converter of the present invention.

According to the radio receiver shown in FIG. 11, an antenna 71 is connected to a high frequency filter 72. The output terminal of the high frequency filter 72 is connected to a frequency converter 74 through a low noise amplifier circuit 73. The output terminal of the frequency changer 74 is connected to a frequency converter 77 through an intermediate filter 75 and a variable gain amplifier 76. The output terminal of the frequency converter 77 is connected to a digital processing unit 79 through a variable resolution A/D converter 78 based on the above embodiments.

There will be described, in the radio receiver of the above configuration, a case that a radio wave environment is not so preferable and only a weak signal is provided, and a case that a radio wave environment is good and a receive signal of sufficient intensity is provided.

When only a weak receive signal can be received from the antenna 71, the radio wave used by a different communication system is removed from the receive signal by the high frequency filter 72. Thereafter, the receive signal is amplified with the low noise amplifier circuit 73. Usually a filter has a little loss in a pass band, so that an output signal amplitude becomes smaller than an input signal amplitude. In addition, even if it is a low noise amplifier circuit, there is a noise in the low noise amplifier circuit. As a result, a signal-to-noise power ratio in an output side deteriorates than that in an input side.

The signal amplified with the low noise signal amplifier 73 is input to be input to the frequency converter 74 and converted into an intermediate frequency. The intermediate frequency filter 15 removes a signal other than a receive channel from the output signal from the frequency converter 74. The signal of the intermediate frequency filter 15 is amplified with the variable gain amplifier 76. When an input signal is weak, the gain of the variable gain amplifier 76 is increased. For this reason, a noise is largely amplified, and a large noise is output. In other words, the signal that a signal-to-noise power ratio is small is output.

The output of the variable gain amplifier 76 is converted with the frequency conversion circuit 77 into the low frequency which can be converted by the ADC and is input to the variable resolution AD converter 78. Since the gain of the variable gain amplifier 76 is high, the signal amplitude becomes big, but a noise is large, too. In this case, it is not necessary to convert the noise into a digital signal in good precision. The variable resolution A/D converter 78 of the present invention permits the lowering of the resolution in order to reduce power consumption. The digital processing unit 79 can process ordinarily a signal of 10 bits, for example, but may process a signal of 9 bits. However, usually, it may process the signal of 10 bits. When the digital processing unit 79 processes the signal of 10 bits, it is possible to continue to output 0 (Low) as the LSB output of the variable A/D converter 78.

The signal converted into a digital signal is decoded to output as a voice and an image or data. There is a communication system which uses the same modulation mode in a case that the radio wave environment is good and a case that it is no good. However, in the case that, for example, a multi-valued QAM modulation and a QPSK modulation are switched according to a signal-to-noise power ratio, if a resolution is decreased at the time of the QPSK modulation, and increased at the time of the multi-valued QAM modulation, the digital signal processing unit 79 may be only a slight change when the variable resolution A/D converter circuit 78 is introduced.

When the radio wave environment is good, the operation from the antenna 1 to the intermediate frequency filter 75 is similar to that when it is weak. Since an input signal has a large amplitude in the variable gain amplifier 76, a gain is lowered. When the receive signal is powerful, there is a case that makes the gain of the variable gain amplifier 76 a minus to generate an output of amplitude smaller than the input signal amplitude. In such case, even if a signal amplitude input to the A/D converter 78 is the same as that when a weak signal is received, a noise power becomes very small. When a noise is small, the analog-to-digital conversion is done with a high resolution. In the case of switching the modulation mode in particular to use a multi-valued QAM, the use of a high resolution ADC permits a high speed data transmission.

As discussed above, according to the current invention, there is provided an A/D converter wherein a resolution is variable and power consumption can be reduced at low resolution effectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable resolution analog-to-digital converter comprising:
   a sample-and-hold circuit including a plurality of sample-and-hold units connected in parallel and selectively activated corresponding to a required resolution to sample and hold an analog input signal;
   a plurality of first conversion stages connected in cascade to an output of the sample-and-hold circuit, each of the first conversion stages including a first sub-analog-to-digital converter unit configured to convert a first analog signal to a first digital signal and a plurality of first sub-multiplying-digital-to-analog converter units connected in parallel and selectively activated according to the required resolution to convert the first digital signal to a second analog signal, generate a first difference signal between the first analog signal and the second analog signal and multiply the first difference signal by a given value, the first analog signal being an analog signal corresponding to the analog input signal;
   a plurality of second conversion stages connected in cascade to an output of a last one of the first conversion stages, each of the second conversion stages including a second sub-analog-to-digital converter unit configured to convert a third analog signal into a second digital signal and a second sub-digital-to-analog converter unit to convert the second digital signal into a fourth analog signal and output a second difference signal between the third analog signal and the fourth analog signal, the third analog signal being an analog signal corresponding to the analog input signal; and
   a synthesis circuit to synthesize the first digital signal output from each of the first conversion stages and the second digital signal output from each of the second conversion stages, to generate a digital output signal.

2. The variable resolution analog-to-digital converter according to claim 1, wherein the first conversion stages each include a switch unit to connect all of the sample-and-hold units in parallel when the required resolution is a first resolution and to connect one of the sample-and-hold units when it is a second resolution lower than the first resolution.

3. The variable resolution analog-to-digital converter according to claim 1, wherein the first conversion stages each include a switch unit to connect all of the sub-digital-to-analog converter units in parallel when the required resolution is a first resolution and to connect one of the sub-digital-to-analog converter units when it is a second resolution lower than the first resolution.

4. The variable resolution analog-to-digital converter according to claim 1, which includes a third sub-analog-to-digital converter unit connected to a last one of the second conversion stages to convert the second difference signal output from the last one of the second conversion stages into a digital signal.

5. The variable resolution analog-to-digital converter according to claim 1, wherein the first conversion stages are used for most significant bits and the second conversion stages are used for least significant bits.

6. The variable resolution analog-to-digital converter according to claim 1, wherein an initial one of the first conversion stages is supplied with an output signal of the sample-and-hold circuit as the first analog signal, and each of the remaining ones of the first conversion stages is supplied, as the first analog signal, with the first difference signal of a preceding one of the first conversion stages that is multiplied by the given value.

7. The variable resolution analog-to-digital converter according to claim 1, wherein an initial one of the second conversion stages is supplied with the first difference signal of a last one of the first conversion stages as the third analog signal, and each of the remaining ones of the second conversion stages is supplied with the second difference signal of a preceding one of the second conversion stages as the third analog signal.

8. The variable resolution analog-to-digital converter according to claim 1, wherein the second sub-digital-to-analog converter unit includes a digital-to-analog converter unit to convert the second digital signal into the fourth analog signal, a subtracter to subtract the fourth analog signal from the third analog signal to output the second difference signal, and a residual amplifier to amplify the second difference signal.

9. A variable resolution analog-to-digital converter, comprising:
   a sample-and-hold circuit including a plurality of sample-and-hold units which are connected in parallel and selectively used corresponding to a reguired resolution to sample and hold an analog input signal;
   a plurality of conversion stages connected in cascade to an output of the sample-and-hold circuit, each of the conversion stages including a sub-analog-to-digital converter unit configured to convert a first analog signal into a digital signal and a sub-digital-to-analog converter unit to convert the digital signal into a second analog signal and output a difference signal between the first analog signal and the second analog signal, the first analog signal being an analog signal corresponding to the analog input signal;
   a switch which turns on or off according to the reguired resolution to bypass at least an initial stage of the conversion stages;
   a synthesis circuit configured to synthesize digital signals each provided by each of the conversion stages, to generate a digital output signal; and
   a clock phase inverting circuit configured to invert, when the switch turns on, a phase of a clock signal supplied to the conversion stages except for at least the initial one of the conversion stages with respect to a phase of the clock signal when the switch turns off.

10. A variable resolution analog-to-digital converter comprising:
    a sample-and-hold circuit including a plurality of sample-and-hold units which are connected in parallel and selectively used according to a required resolution to sample and hold an analog input signal;

a plurality of unit delay circuits connected in cascade to delay an output signal from the sample-and-hold circuit;

an analog linear transformation circuit to subject a set of output signals from the unit delay circuits to a first linear transformation to output a plurality of linear transformed analog signal;

a plurality of sub-analog-to-digital converter units to convert the linear transformed analog signal into a plurality of digital signals;

a digital linear transformation circuit to subject a set of digital signals of the digital signals output from the sub-analog-to-digital converter units to a second linear conversion that is an inverting transformation of the first linear transform, to output a plurality of digital signals output by the sub-analog-to-digital converter units; and a digital delay adder circuit to add the linear digital signals with the same delay time as that of the analog delay circuit to generate a digital output signal.

11. The variable resolution analog-to-digital converter according to claim 10, wherein each of the unit delay circuits includes a plurality of sub-delay circuits connected in parallel selectively according to the required resolution to delay an output signal from the sample-and-hold circuit.

12. The variable resolution analog-to-digital converter according to claim 10, wherein the analog linear transformation circuit comprises a variable analog linear transformation circuit whose linear transformation matrix is variable and the sub-analog-to-digital converter units are selectively used according to at least one signal from the variable analog linear transformation circuit, the number of used sub-analog-to-digital converter units being determined by the required resolution.

13. The variable resolution analog-to-digital converter according to claim 12, wherein the digital linear transformation circuit comprises a variable digital linear transformation circuit whose linear transformation matrix is variable.

14. A radio receiver comprising:

a high frequency filter to filter a receive signal;

a low noise amplifier circuit to amplify the filtered receive signal;

a frequency converter to convert the filtered receive signal into an intermediate frequency signal;

an intermediate filter to filter the intermediate frequency signal;

a variable gain amplifier to amplify the filtered intermediate frequency signal;

a frequency converter to convert the amplified intermediate frequency signal into a low frequency signal; and a variable resolution analog-to-digital circuit to subject the low frequency signal to a variable resolution analog-to-digital conversion, the circuit comprising:

a sample-and-hold circuit including a plurality of sample-and-hold units connected in parallel and selectively activated corresponding to a required resolution to sample and hold an analog input signal;

a plurality of first conversion stages connected in cascade to an output of the sample-and-hold circuit, each of the first conversion stages including a first sub-analog-to-digital converter unit configured to convert a first analog signal to a first digital signal and a plurality of first sub-multiplying-digital-to-analog converter units connected in parallel and selectively activated according to the required resolution to convert the first digital signal to a second analog signal, generate a first difference signal between the first analog signal and the second analog signal and multiply the first difference signal by a given value, the first analog signal being an analog signal corresponding to the analog input signal;

a plurality of second conversion stages connected in cascade to an output of a last one of the first conversion stages, each of the second conversion stages including a second sub-analog-to-digital converter unit configured to convert a third analog signal into a second digital signal and a second sub-digital-to-analog converter unit to convert the second digital signal into a fourth analog signal and output a second difference signal between the third analog signal and the fourth analog signal, the third analog signal being an analog signal corresponding to the analog input signal; and a synthesis circuit to synthesize the first digital signal output from each of the first conversion stages and the second digital signal output from each of the second conversion stages, to generate a digital output signal.

* * * * *

UNITED STATES PATENT AND TRADEMARK OFFICE
CERTIFICATE OF CORRECTION

| | | |
|---|---|---|
| PATENT NO. | : 7,313,380 B2 | Page 1 of 1 |
| APPLICATION NO. | : 10/725519 | |
| DATED | : December 25, 2007 | |
| INVENTOR(S) | : Yamaji | |

It is certified that error appears in the above-identified patent and that said Letters Patent is hereby corrected as shown below:

Claim 9, column 12, line 41, change "reguired" to --required--.

Claim 9, column 12, line 53, change "reguired" to --required--.

Signed and Sealed this

Twenty-ninth Day of April, 2008

JON W. DUDAS
*Director of the United States Patent and Trademark Office*